US011363717B2

(12) United States Patent
Kong et al.

(10) Patent No.: US 11,363,717 B2
(45) Date of Patent: Jun. 14, 2022

(54) INDUCTOR ARRAY AND SUPPORT

(71) Applicant: Intel Corporation, Santa Clara, CA (US)

(72) Inventors: Jackson Chung Peng Kong, Pinang (MY); Bok Eng Cheah, Pinang (MY); Ranjul Balakrishnan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/090,949

(22) Filed: Nov. 6, 2020

(65) Prior Publication Data

US 2022/0078913 A1 Mar. 10, 2022

(30) Foreign Application Priority Data

Sep. 4, 2020 (MY) ............................ PI2020004582

(51) Int. Cl.
*H05K 1/18* (2006.01)
*H05K 1/16* (2006.01)

(52) U.S. Cl.
CPC ....... *H05K 1/165* (2013.01); *H05K 2201/086* (2013.01); *H05K 2201/10287* (2013.01)

(58) Field of Classification Search
CPC .. H05K 1/165; H05K 1/181; H05K 2201/086; H05K 2201/10287
See application file for complete search history.

(56) References Cited

U.S. PATENT DOCUMENTS

| | | | | |
|---|---|---|---|---|
| 8,583,043 | B2 * | 11/2013 | Kato ........................ | H01Q 9/24 455/41.2 |
| 2002/0067316 | A1 * | 6/2002 | Yokoshima .............. | H01Q 9/27 343/895 |
| 2005/0057334 | A1 * | 3/2005 | Kitagawa .............. | H01F 17/045 336/83 |
| 2007/0164414 | A1 * | 7/2007 | Dokai .................. | H05K 1/0243 257/679 |
| 2009/0002130 | A1 * | 1/2009 | Kato ................ | G06K 19/07749 340/10.1 |
| 2020/0315000 | A1 * | 10/2020 | Zhang ..................... | H02M 1/44 |

* cited by examiner

*Primary Examiner* — Hoa C Nguyen
(74) *Attorney, Agent, or Firm* — Viering, Jentschura & Partner mbB (57) ABSTRACT

For circuit boards that may be used in computing devices, a horizontal inductor, or an array of such inductors, may be coupled to a circuit board having a plurality of signal routing lines in a second layer from a surface of the circuit board and the horizontal inductor is positioned over these signal routing lines and may generate magnetic field lines that directionally follow the signal routing lines. The horizontal inductor may have a coiled wire with a central axis that is oriented horizontally with the surface of the circuit board. The horizontal inductor, or an array of such inductors, may be coupled to a support board attached to the circuit board.

20 Claims, 10 Drawing Sheets

FIG. 1

PRIOR ART

INDUCTOR ARRAY AND SUPPORT

CROSS-REFERENCE TO RELATED APPLICATIONS

This application claims priority to Malaysian Application No. PI2020004582, filed on Sep. 4, 2020, which is incorporated herein in its entirety.

BACKGROUND

There are numerous applications for inductors, especially in analog circuits, signal processing, and semiconductor devices. An inductor is a passive two-terminal electrical component that stores energy in a magnetic field when electric current flows through it. An inductor typically consists of an insulated wire wound into a coil. The applications may range from the use of large inductors in power supplies, which work in conjunction with filter capacitors to remove ripples from the direct current output, to the small inductors made of a ferrite bead or torus installed around a cable to prevent radio frequency interference from being transmitted down the wire.

For semiconductor devices, inductors are one of the main components used in switching voltage regulator (VR) systems. When the semiconductor is switched "on", the current in the inductor ramps up and energy is stored and when it is switched "off", the stored energy is released into the load. The inductor supplies energy to the circuit to keep current flowing during the "off" switching periods and enables topographies where the output voltage is higher than the input voltage. The amount of the current changes in an inductor during a switching cycle is known as the ripple current and a VR system filters the ripples of incoming pulsed voltage.

The presence of inductors may affect the electrical properties of printed circuit board (PCB) traces, which is an important consideration as electronic components continue to increase in speed. As a design "rule of thumb", placing signal routings/traces immediately beneath inductor components in PCB is generally prohibited due to the significant noise coupling ascribed to the inductor's magnetic field (H-field) may lead to signal quality degradation, e.g., increased signaling jitter that may reduce signal transmission bandwidth. This restriction in the placement of signal routings may pose a significant challenge when seeking to aggressively reduce board size.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

Generally, an inductor consists of a coil of conducting material, typically insulated copper wire, wrapped around a "core" of either a plastic or a dielectric material (to create an air-core inductor) or a ferromagnetic material, which is called an "iron core" inductor. The high permeability of the ferromagnetic core increases the magnetic field and confines it closely to the inductor, thereby increasing the inductance. An inductor may typically have a casing of dielectric material surrounding the coiled wire to provide mechanical support, which includes the dielectric material filling the center region of the coiled wire that forms the core.

Figure 1:
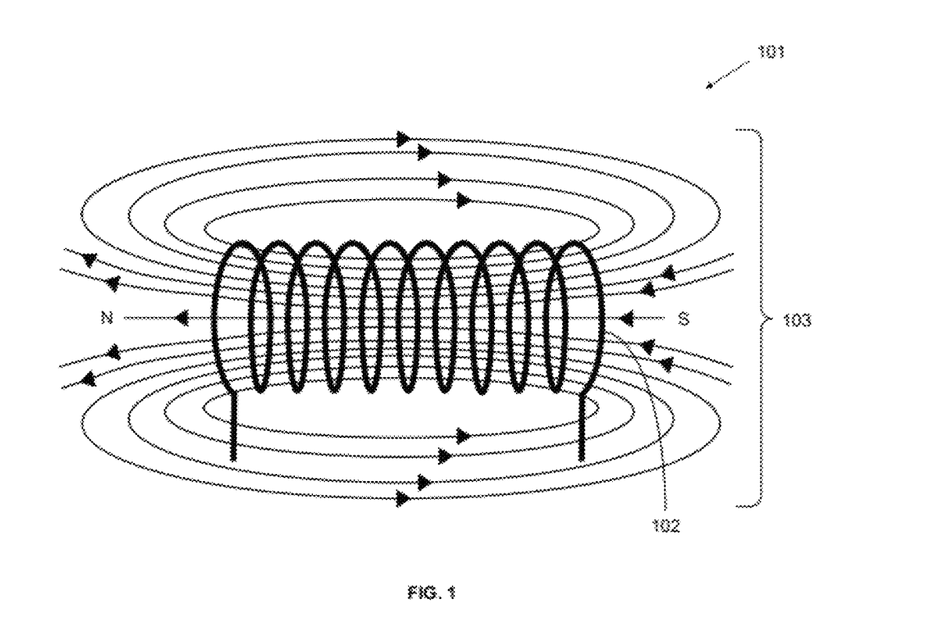
FIG. 1 shows an illustrative representation of an inductor's magnetic field.

In a representation shown in FIG. 1, a coiled inductor 101 has a magnetic field 103 that passes through the central space or core formed by the winding of the conductive wire 102. The magnetic field 103 is created by the current passing through the wire and directionally moves from the north magnetic pole (N) to the south magnetic pole (S) when a coiled wire body is placed horizontally.

Figure 2:
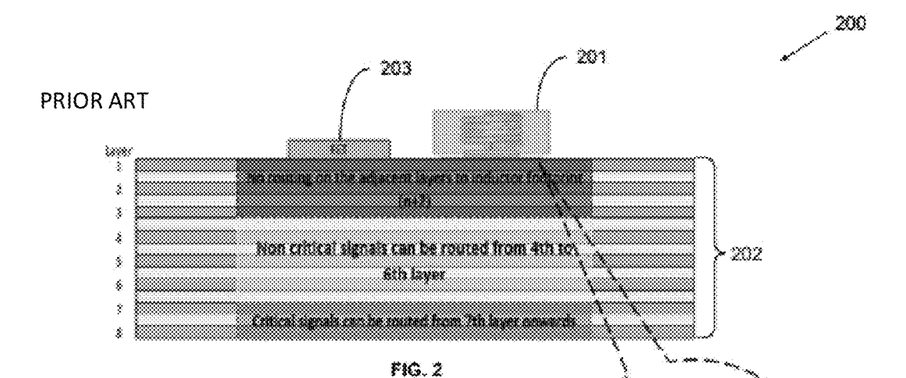
FIG. 2 shows an illustrative representation of a multilayer circuit board with a semiconductor device and an inductor.

As shown in FIG. 2, a typical device 200 may have a "vertical" inductor 201 and a semiconductor device 203 (e.g., a field effect transistor) positioned on a printed circuit board (PCB) 202 having several layers. For typical layout designs, there will be no signal routings/traces placed immediately beneath inductor components on the PCB (i.e., a "keep-out-zone") due to significant noise coupling ascribed to the magnetic field (also known as an H-field).

Figure 2A:
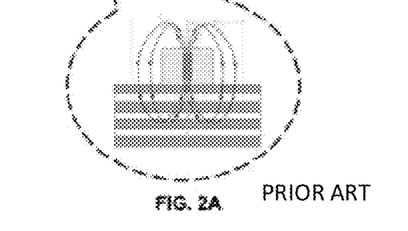
FIG. 2A shows an illustrative representation of the inductor's magnetic field according to the device shown in FIG. 2.

As illustrated in the representation provided in FIG. 2A, the possible effects of an inductor's H-field may reach as far as the $3^{rd}$ layer of the PCB. The signal routings may need to be placed at the $4^{th}$ layer onwards and may still be limited to non-critical or low-speed signals (<1 Gbps). The "critical" signal routings (e.g., for clock signals and/or high-speed signals with data rate ≥10 Gbps) may need to be placed from the $7^{th}$ layer onwards, which may increase PCB and/or motherboard layer count and/or require additional PCB real estate to avoid the effects of the inductor's H-field.

According to the present disclosure, an inductor having its coiled wire body oriented horizontally may provide improved signal integrity and performance for high-speed multi-Gbps signals (>20 Gbps), such as for serializer/deserializer (SerDes) and peripheral component interconnect express (PCIe) signals. It may permit the use of shorter vertical transition (e.g., micro-vias), and minimize signal reflections or crosstalk noise coupling through routing these signals adjacent to the PCB surface, i.e., the same layer/area in the vicinity of switching VR module inductors. In addition, the use of the presently disclosed horizontal inductor and horizontal inductor arrays may enable platform miniaturization through the elimination of associated vertical inductor X-Y footprint, and the need for PCB routing keep-out-zone adjacent to vertical inductor components.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

Figure 3:
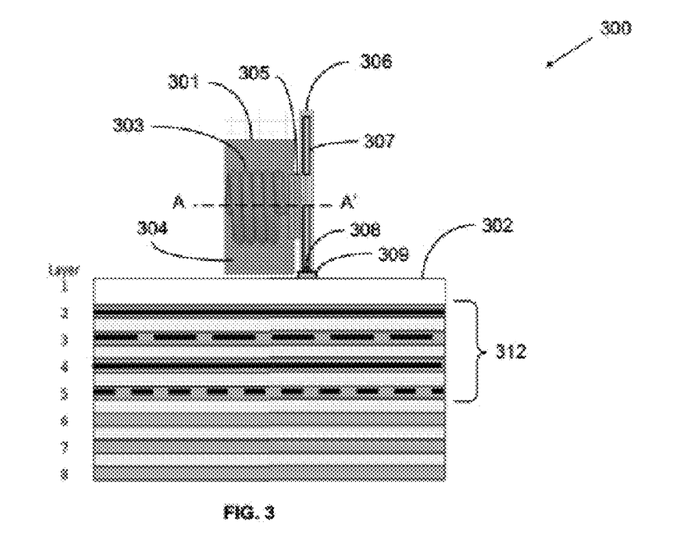
FIG. 3 shows an exemplary cross-section view of a device with an inductor according to an aspect of the present disclosure.

In an aspect of the present disclosure, as shown in FIG. 3, an exemplary device 300 may have a "horizontal" inductor 301 positioned on a PCB 302. The inductor 301 has a central axis, which is shown as an A-A' dashed line, that is oriented horizontally or parallel to the surface of the PCB 302, and creates an H-field similar to that shown in FIG. 1. In this configuration, a horizontal inductor may generate magnetic field lines that directionally follow the signal routing lines. In this aspect, the horizontal inductor 301 may have a coiled wire body 303, a casing 304, and two connection members 305 (only one is shown) that may be coupled to a support board 306. Also in this aspect, a plurality of signal routing lines or traces 312, both critical and non-critical, may be placed starting in a second layer from a surface of the PCB 302 and in the layers below (i.e., $3^{rd}$, $4^{th}$, $5^{th}$, etc.), according to the present disclosure. In an aspect, the support board 306 may be positioned perpendicular to the surface of the PCB 302. The connection members 305 may be connected to the terminal ends of the coiled wire 303. In an aspect, the casing 304 may be made of various materials, including a ferrite material, a dielectric layer and/or epoxy polymer resin composites.

Also shown in FIG. 3, the support board 306 may have a conductive layer 307 coupled, using a solder paste 308 or other conductive adhesives, to a contact pad 309 on the PCB 302. In another aspect, as an example, the support board 306 may be made of a rigid material, such as epoxy resin with reinforced fiberglass, and the conductive layer 307 may be made of copper. In an aspect, the conductive layer 307 may include two or more conductive layers with an interleaving dielectric layer therebetween. The use of the horizontal inductor 301 may allow signal lines to be placed in a second layer from the surface of the PCB 302 under the horizontal inductor 301 due to the reduced noise coupling. It should be understood that coiled wire body 303 is exemplary for a horizontal inductor according to the present disclosure and other inductor bodies producing a similar H-field may also be used, It is within the scope of the present disclosure to have a device using both conventional vertical inductors and the present horizontal inductors as required (i.e., "mix and match"). In such an aspect, the vertical inductors may be positioned away from signal lines placed in a second layer from the surface of a PCB.

Figure 4:
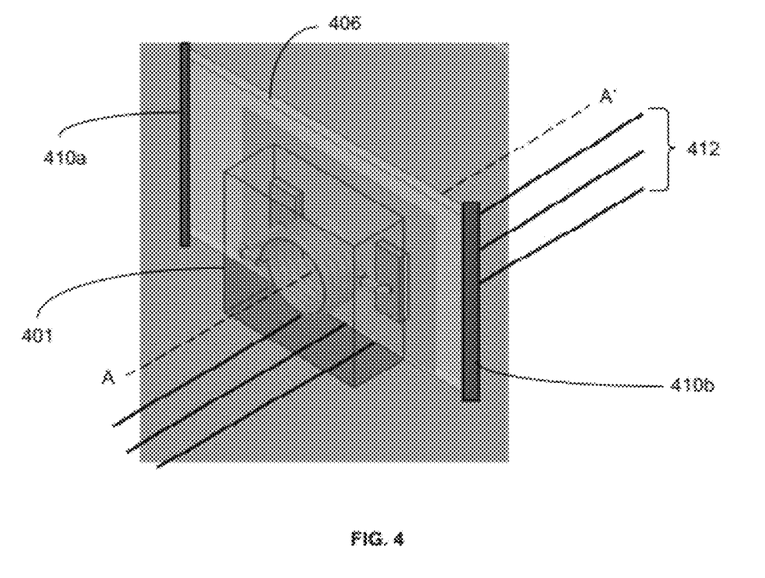
FIG. 4 shows an exemplary perspective view of an inductor and a support board according to another aspect of the present disclosure.

In FIG. 4, an exemplary perspective view of an inductor 401 and a support board 406 are shown according to another aspect of the present disclosure. In this aspect, the inductor 401 may have a central axis, which is shown as an A-A' dashed line, that is configured horizontally or parallel to signal/trace lines 412 that may be placed starting in a second layer under the surface of a PCB (not shown). In addition, there may be a need for supports to attachably secure the inductor 401 and the support board 406 to the PCB; for example, in an aspect, bracket supports 410a and 410b may be provided as shown in FIG. 4. In an aspect, the bracket supports 410a and 410b may be attached to the PCB through a surface mounting process. In an aspect, the bracket supports 410a and 410b may be extended to provide mechanical support to two or more support boards arranged in parallel (not shown). It is within the scope of the present disclosure to provide such supports using differing designs; for example, the casing support 514 shown in FIG. 5A.

Figure 5:
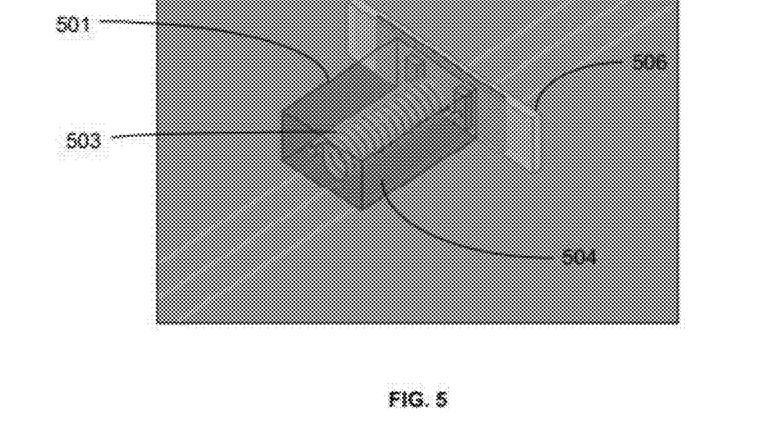
FIG. 5 shows an exemplary perspective view of an inductor and a support board according to yet another aspect of the present disclosure.
Figure 5A:
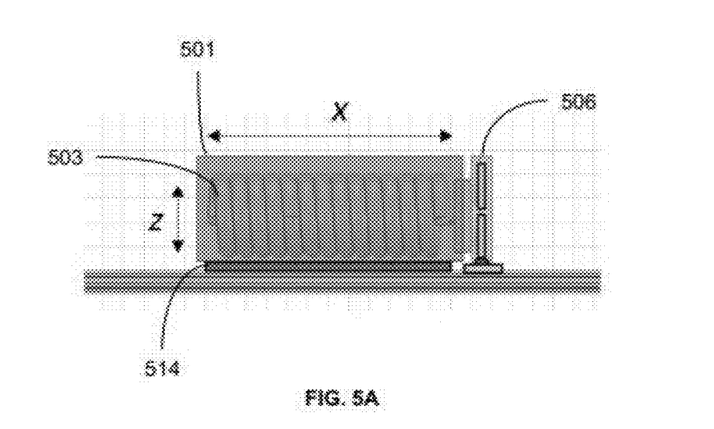
FIG. 5A shows a cross-section view of the inductor and the support board according to the aspect shown in FIG. 5.

FIG. 5 shows an exemplary perspective view and FIG. 5A shows a cross-section view of a horizontal inductor 501 according to yet another aspect of the present disclosure. In this aspect, the inductor 501 may have an extended or elongated coiled wire 503 and a casing 504 to provide a needed inductance capacity and comply with a given height restriction.

A typical vertical inductor may have dimensions of approximately 7×6×3 mm (i.e., x-length, y-width, z-height) and an inductance value of approximately 0.1 μH. If there is a z-height restriction, the configuration shown in FIG. 3 may not be suitable.

Accordingly, to achieve a similar inductance value, the number turns for the coiled wire 503 may need to be increased while the ferrite core area may be reduced as shown in FIG. 5.

As shown in FIG. 5A, the z-height of the support board 506 may be reduced, for example, to 3 mm or less so as to be equivalent or lower than the conventional vertical inductor. And, in turn, the x-length may be increased as needed, thereby, a horizontal inductor may be used in computing devices with a z-height constraint. In an aspect, a horizontal inductor may have an x-length in the range of 2 to 6 mm, which may further be increased depending on performance and design considerations. In another aspect, the height of the casing 504 may be aligned to the height of the support board 506. In another aspect, the horizontal inductor 501 may have a casing support 514 to further secure the horizontal inductor 501. In yet another aspect, the casing support 514 may include an adhesive film layer, a metal frame, or a polymer spacer.

Figure 6:
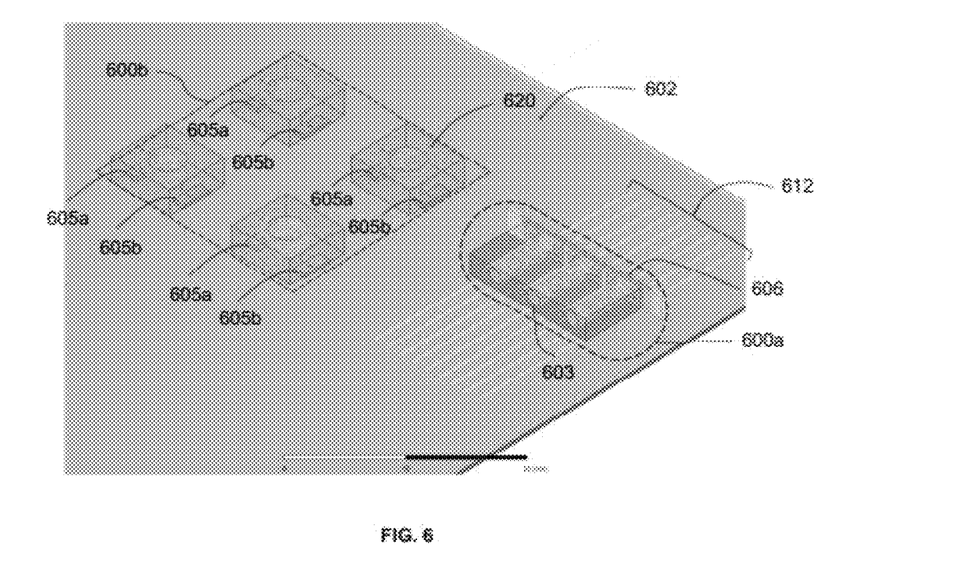
FIG. 6 shows a side-by-side comparison of exemplary footprints for conventional inductors versus horizontal inductors according to an aspect of the present disclosure.

FIG. 6 shows a side-by-side comparison of exemplary PCB footprints for an array of horizontal inductors 600a, according to an aspect of the present disclosure, verses an array of conventional vertical inductors 600b. In this aspect, the PCB footprint for the array of horizontal inductors 600a may include three extended coiled wires 603 attached to a support board 606 on a PCB 602, and the PCB footprint for the array of conventional vertical inductors 600b may include four vertical inductors 620 attached to the PCB 602. The PCB footprint for the array of horizontal inductors 600a may be less than half of the PCB footprint for the array of conventional vertical inductors 600b according to the present disclosure.

In addition, the PCB footprint for the array of horizontal inductors 600a may permit a compact PCB layout, with high-density signal lines 612 that may be placed in a second layer of the PCB 602 directly under the horizontal inductors. In another aspect, a PCB contact pad footprint for three horizontal inductor array (underneath the support board 606) may also be less than half of a PCB contact pad footprint (equivalent to the footprints of connection members 605a and 605b) for four vertical inductor array 600b.

Figure 7:
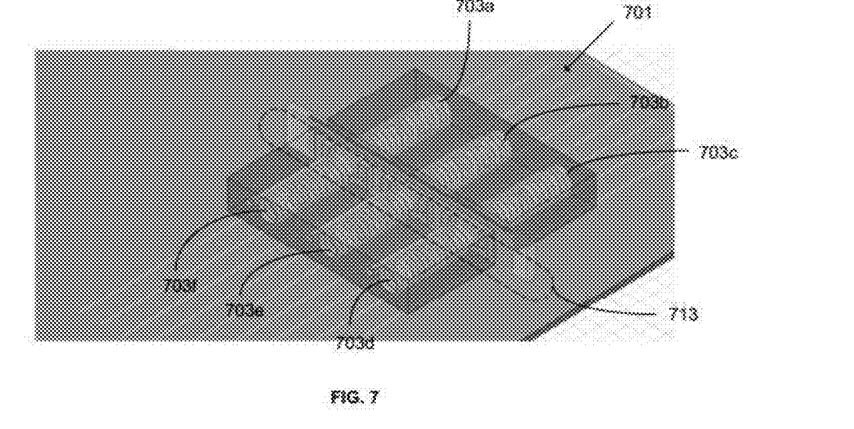
FIG. 7 shows an exemplary perspective view of an inductor array and a support board according to yet another aspect of the present disclosure.
Figure 7A:
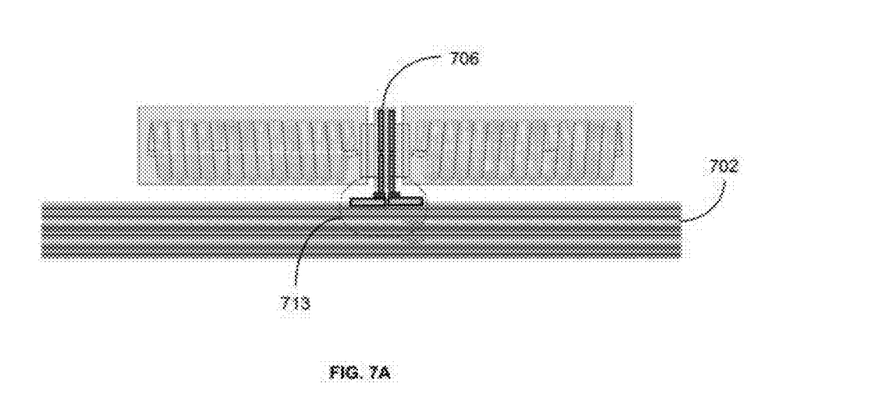
FIG. 7A shows a cross-section view of the inductor array and the support board according to the aspect shown in FIG. 7.

According to yet another aspect of the present disclosure, FIG. 7 shows an exemplary perspective view and FIG. 7A shows a cross-section view of a horizontal inductor array 701 and a "double-sided" support board 706. The horizontal inductor array 701 may have elongated coiled wire bodies 703a, 703b, 703c, 703d, 703e, and 703f coupled to the double-sided support board 706. In this aspect, the elongated coiled wire bodies 703a, 703b, 703c, 703d, 703e, and 703f may have the same length as shown in FIG. 7. Also in this aspect, the double-sided support board 706 may have a small contact pad footprint 713 on the surface of a PCB 702. It is within the scope of the present disclosure to use two single-sided support boards positioned back-to-back in place of a double-sided support board.

In some aspects, the horizontal array 701 may have different configurations, for example, with only the elongated coiled wire bodies 703a, 703c, 703d, and 703f coupled to the double-sided support board 706, or only the elongated coiled wire bodies 703a, 703c, and 703e coupled to the double-sided support board 706, as well as other configurations. It is also within the scope of the present disclosure to vary the lengths of the elongated coiled wire bodies of the horizontal inductors used in configuring an array to optimize their performance. In an aspect, the elongated coiled wire bodies 703a, 703b and 703c may have a first length, e.g., 2 to 4 mm, and 703d, 703e, and 703f may have a second length that may be greater than the first length, e.g., 4 to 6 mm. In another aspect, a configuration for an array may have horizontal inductors with different lengths that are side-by-side, e.g., long-short-long and/or short-long-short. In a further aspect, the horizontal inductor array 701 may have supports under the extended coiled wires (not shown) similar to the casing support 514 shown in FIG. 5A.

Figure 8:
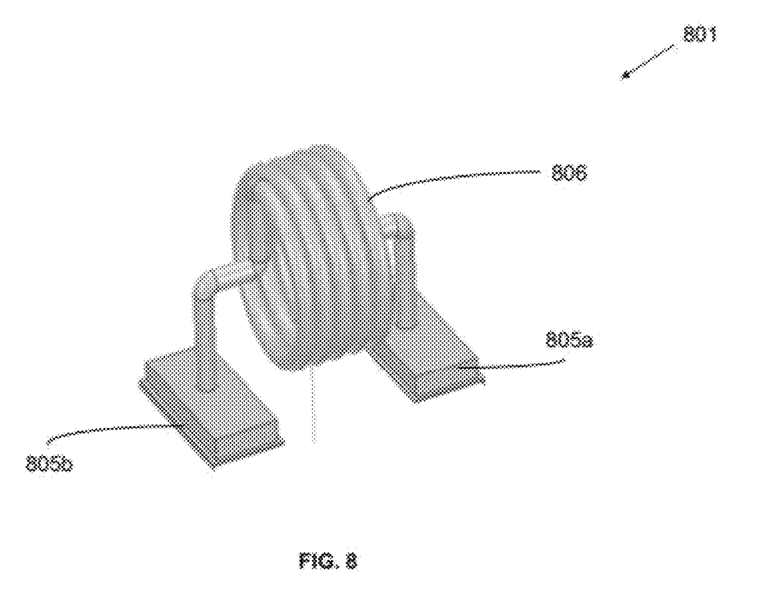
FIG. 8 shows an exemplary horizontal inductor according to another aspect of the present disclosure.

FIG. 8 shows an exemplary horizontal inductor 801 according to another aspect of the present disclosure. The horizontal inductor 801 may be positioned on a PCB (not shown) to generate central magnetic field lines that directionally follow the signal routing lines without the need for a support board. In this aspect, the horizontal inductor 801 may have a coiled wire body 806 that is supported between terminal connection members 805a and 805b.

Figure 9:
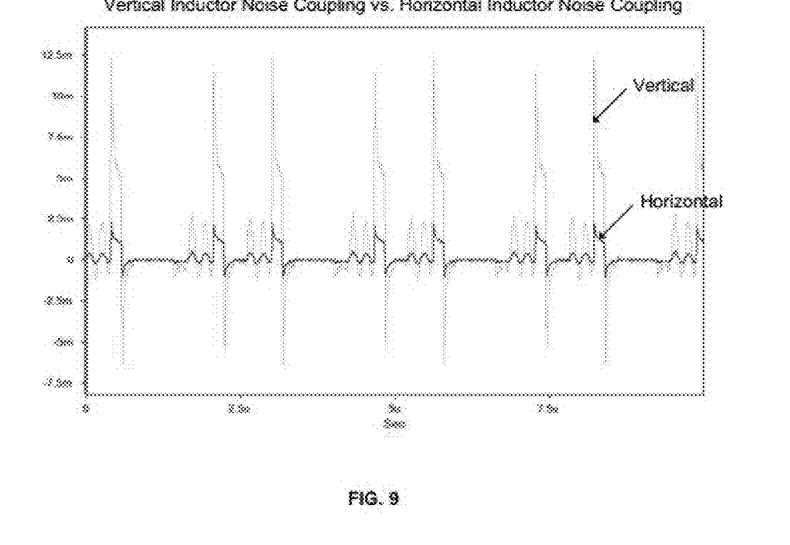
FIG. 9 shows a comparison between the noise coupling from a conventional vertical inductor and a horizontal inductor according to an aspect of the present disclosure.

FIG. 9 shows a comparison between the noise coupling from a conventional vertical inductor and a horizontal inductor of the present disclosure. In this test, the magnetic field noise coupling measurements were taken from a trace (i.e., a microstrip signal lane) that was placed approximately 50 mils away from the respective inductor footprints. As shown in FIG. 9, the present horizontal coil inductor generated only about 20 percent of the induced voltage as compared to that generated by the conventional vertical coil inductor.

Figure 10:
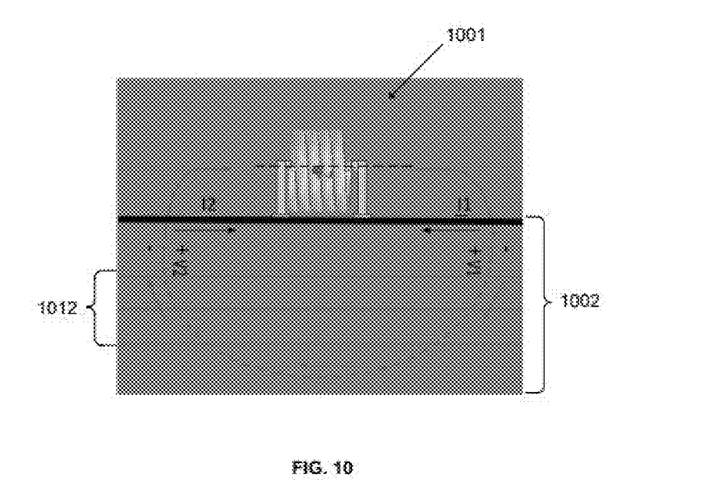
FIG. 10 shows an exemplary representation of an induced voltage and current from a horizontal inductor according to yet another aspect of the present disclosure.

FIG. 10 shows an exemplary representation of the induced voltage and induced current from a horizontal inductor 1001 on a PCB 1002 with high-density signal lines 1012 that may be placed starting in a second layer of the PCB 1002 directly under the horizontal inductors according to yet another aspect of the present disclosure. The interaction between the magnetic field from the horizontal inductor and signal routing lines in a PCB may induce voltages V1 and V2, and their associated current I1 and I2 on the signal routing lines. The induced current I1 and I2, which is in the opposite direction, may be normalized along the signal routing lines. The magnetic field noise coupling may be canceled when using the present horizontal inductors to allow signal routing lines adjacent to PCB's surface. Hence, the need for a keep-out-zone may be eliminated and a smaller contact pad footprint may be achieved by using a support board for a positioning a conventional vertical inductor.

Figure 11:
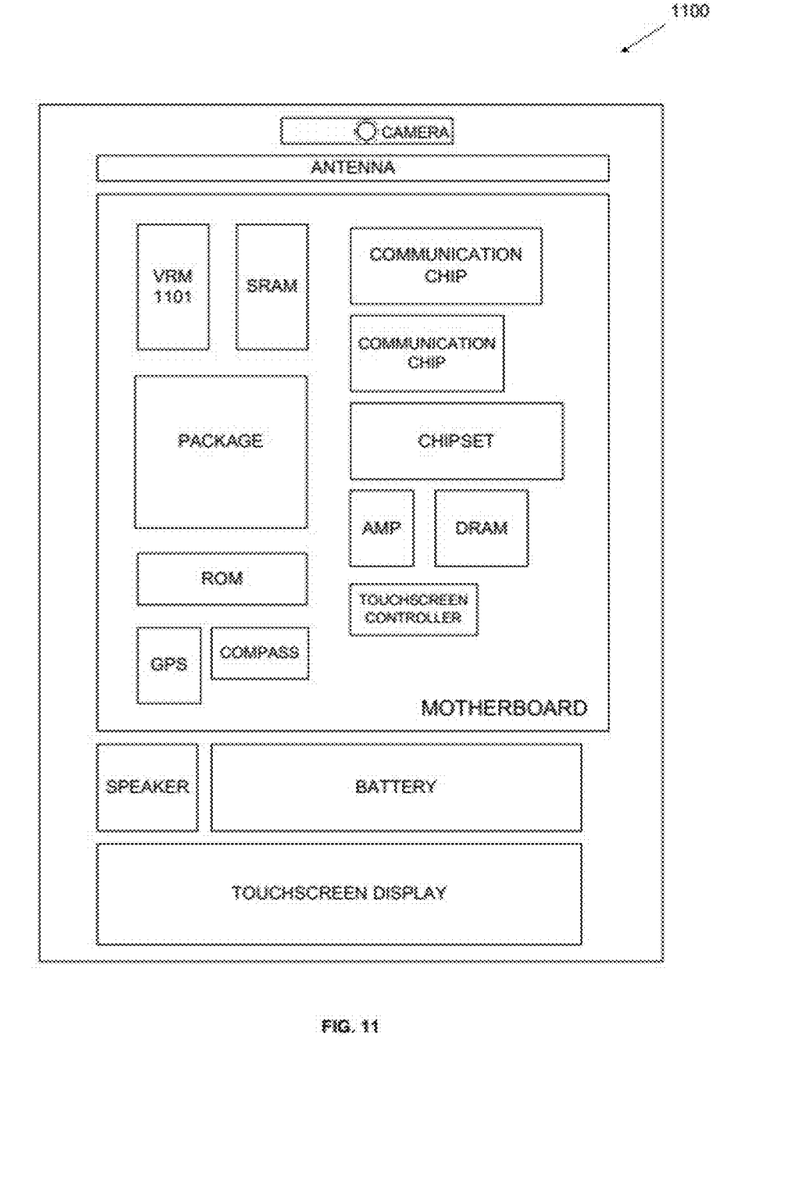
FIG. 11 shows an exemplary computing device according to an aspect of the present disclosure.

FIG. 11 shows an exemplary computing device 1100 having at least one VR module 1101 (VRM) according to an aspect of the present disclosure. It should be understood that the VRM 1101 may represent an array of VR modules. The VRM 1101 may have at least one horizontal inductor (not shown). In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 1100 may be a mobile computing device. In further implementations, the computing device 1100 may be any other electronic device that processes data.

In a further aspect, the computing device 1100 may have a board, such as a motherboard, having several components, including, but not limited to, a semiconductor processor that may or may not be physically and electrically coupled to such motherboard. The other components may include, but are not limited to, volatile memory (e.g., DRAM), non-volatile memory (e.g., ROM), flash memory, a graphics processor, a digital signal processor, a cryptoprocessor, a communication chip, a chipset, an antenna, a display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). It is within the scope of the present disclosure to use, for example, one or more horizontal inductors in other components set forth above.

According to the present disclosure, a computing device using horizontal inductors may include a plurality of communication chips. The communication chips may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip may operate in accordance with other wireless protocols in other aspects. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In another aspect, the communication chip may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not.

The communication chip may implement any of several wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

Figure 12:
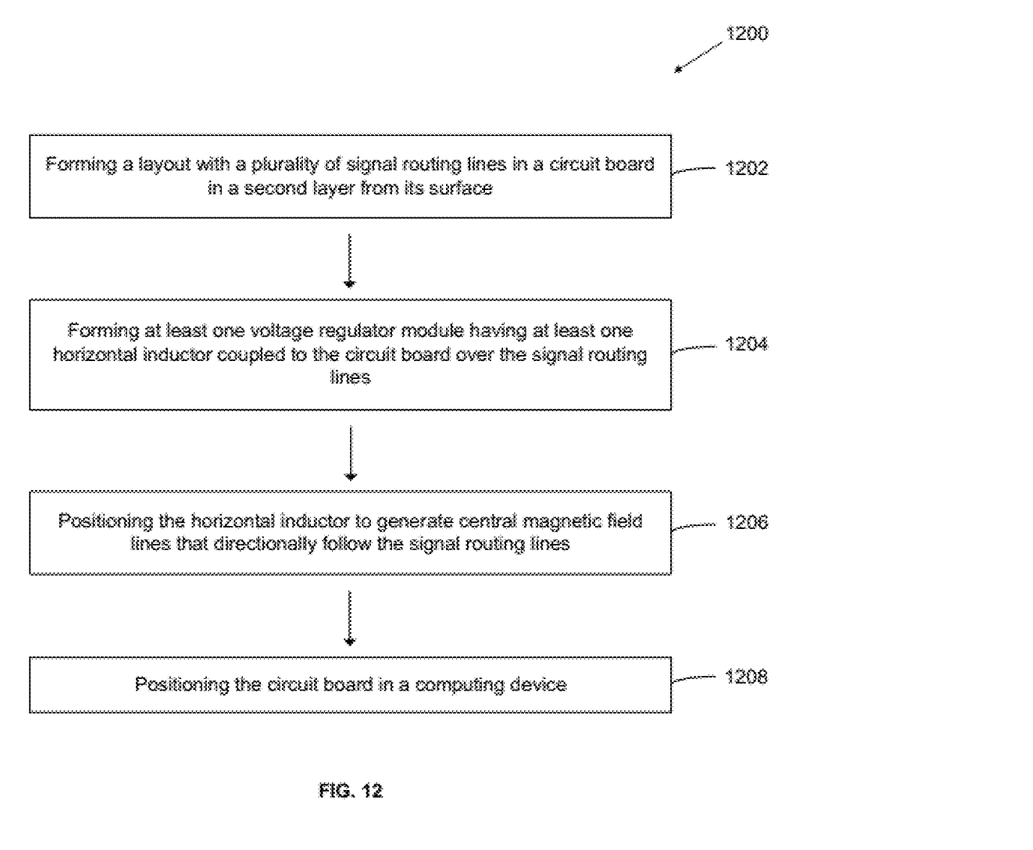
FIG. 12 shows a simplified flow diagram for an exemplary method according to an aspect of the present disclosure.

FIG. 12 shows a simplified flow diagram 1200 for an exemplary method according to an aspect of the present disclosure. In this aspect, as set forth in a first operation 1202, a board layout provides for a plurality of signal routing lines that may be formed in a second layer from a surface a circuit board. In a second part 1204, at least one voltage regulator module having at least one horizontal inductor may be coupled to the circuit board over the signal routing lines. In a third part 1206, the horizontal inductor may be positioned or a have structure that generates central magnetic field lines that directionally follow the signal routing lines. In a fourth part 1208, the circuit board may be positioned in a computing device.

The foregoing aspects of the method for using a horizontal inductor in a layout for a printed circuit board are intended to be non-limiting. It will be apparent to those ordinary skilled practitioners that the foregoing method may be modified without departing from the scope of the present disclosure.

To more readily understand and put into practical effect the present method and device for, particular aspects will now be described by way of examples. For the sake of brevity, duplicate descriptions of features and properties may be omitted.

Examples

Example 1 may include a circuit board having a plurality of signal routing lines in a second layer from a surface of the circuit board and at least one inductor coupled to the circuit board and positioned over the signal routing lines, the inductor configured to generate magnetic field lines that directionally follow the signal routing lines.

Example 2 may include the circuit board of example 1 and/or any other example disclosed herein, in which the at least one inductor further includes a coiled wire having a central axis that is oriented horizontally with the surface of the circuit board.

Example 3 may include the circuit board of example 2 and/or any other example disclosed herein, further including a support board coupled to the circuit board for attaching the inductor and positioning the coiled wire in a horizontal configuration.

Example 4 may include the circuit board of example 3 and/or any other example disclosed herein, in which the coiled wire is elongated horizontally along the central axis from the support board.

Example 5 may include the circuit board of example 1 and/or any other example disclosed herein, in which the at least one inductor further includes the coiled wire having a first end and a second end, and a first connection member supporting the first end and a second connection member supporting the second end of the coiled wire, in which the first and second connection members are attached to the surface of the circuit board to position the coiled wire in a horizontal configuration.

Example 6 may include the circuit board of example 1 and/or any other example disclosed herein, in which the at least one inductor further includes an array of inductors oriented horizontally with the surface of the circuit board.

Example 7 may include the circuit board of example 6 and/or any other example disclosed herein, further including a support board coupled to the circuit board for attaching the array of inductors to position their coiled wires in a horizontal configuration.

Example 8 may include the circuit board of example 7 and/or any other example disclosed herein, in which the array of inductors is a first array of inductors, the circuit board further including the first array of inductors have a first set of elongated coiled wires, and a second array of inductors oriented horizontally with the surface of the circuit board attached to the support board, the second array of inductors have a second set of elongated coiled wires that face in a direction opposite of the first set of elongated coiled wires of the first array of inductors.

Example 9 may include the circuit board of example 2 and/or any other example disclosed herein, in which the at least one inductor further includes a casing material surrounding the coiled wire, and a casing support positioned between the casing material and the circuit board.

Example 10 may include a computing device having a circuit board with a plurality of signal routing lines in a second layer from a surface of the circuit board, and a voltage regulator module having at least one inductor coupled to the circuit board, the inductor is positioned over the signal routing lines and configured to generate magnetic field lines that directionally follow the signal routing lines.

Example 11 may include the computing device of example 10 and/or any other example disclosed herein, in which the at least one inductor further includes a coiled wire having a central axis that is oriented horizontally with the surface of the circuit board.

Example 12 may include the computing device of example 11 and/or any other example disclosed herein, further including a support board coupled to the circuit board for attaching the inductor and positioning the coiled wire in a horizontal configuration.

Example 13 may include the computing device of example 12 and/or any other example disclosed herein, in which the coiled wire is elongated horizontally along the central axis from the support board.

Example 14 may include the computing device of example 10 and/or any other example disclosed herein, in which the inductor further includes the coiled wire having a first end and a second end, and a first connection member supporting the first end and a second connection member supporting the second end of the coiled wire, in which the first and second connection members are attached to the surface of the circuit board to position the coiled wire in a horizontal configuration.

Example 15 may include the computing device of example 10 and/or any other example disclosed herein, in which the at least one inductor further includes an array of inductors oriented horizontally with the surface of the circuit board.

Example 16 may include the computing device of example 15 and/or any other example disclosed herein, further including a support board coupled to the circuit board for attaching the array of inductors to position their coiled wires in a horizontal configuration.

Example 17 may include the computing device of example 16 and/or any other example disclosed herein, in which the array of inductors is a first array of inductors, the circuit board further including the first array of inductors have a first set of elongated coiled wires, and a second array of inductors, attached to a second support board coupled to the circuit board.

Example 18 may include the computing device of example 10 and/or any other example disclosed herein, wherein the at least one inductor further includes a casing material surrounding the coiled wire, and a casing support positioned between the casing material and the circuit board.

Example 19 may include a method directed to forming a circuit board having a plurality of signal routing lines in a second layer from a surface of the circuit board, and forming a voltage regulator module having at least one inductor coupled to the circuit board and positioned over the signal routing lines, the inductor configured to generate magnetic field lines that directionally follow the signal routing lines.

Example 20 may include the method of example 19 and/or any other example disclosed herein, attaching a support board to the circuit board, in which the at least one inductor is coupled to the support board.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A circuit board comprising:
   a plurality of signal routing lines in a second layer from a surface of the circuit board; and
   at least one discrete inductor coupled to the circuit board and positioned over the signal routing lines, the inductor configured to generate magnetic field lines that directionally follow the signal routing lines.

2. The circuit board of claim 1, wherein the at least one inductor further comprises a coiled wire comprising a central axis that is oriented horizontally with the surface of the circuit board.

3. The circuit board of claim 2, further comprising a support board coupled to the circuit board for attaching the inductor and positioning the coiled wire in a horizontal configuration.

4. The circuit board of claim 3, in which the coiled wire is elongated horizontally along the central axis from the support board.

5. The circuit board of claim 2, in which the at least one inductor further comprises:
   the coiled wire comprising a first end and a second end; and
   a first connection member supporting the first end and a second connection member supporting the second end of the coiled wire, in which the first and second connection members are attached to the surface of the circuit board to position the coiled wire in a horizontal configuration.

6. The circuit board of claim 2, wherein the at least one inductor further comprises:
   a casing material surrounding the coiled wire; and
   a casing support positioned between the casing material and the circuit board.

7. The circuit board of claim 1, in which the at least one inductor further comprises an array of inductors oriented horizontally with the surface of the circuit board.

8. The circuit board of claim 7, further comprising a support board coupled to the circuit board for attaching the array of inductors to position their coiled wires in a horizontal configuration.

9. The circuit board of claim 8, wherein the array of inductors is a first array of inductors, the circuit board further comprising:
   the first array of inductors comprising a first set of elongated coiled wires; and
   a second array of inductors oriented horizontally with the surface of the circuit board attached to the support board, the second array of inductors comprising a second set of elongated coiled wires that face in a direction opposite of the first set of elongated coiled wires of the first array of inductors.

10. A computing device comprising:
    a circuit board comprising a plurality of signal routing lines in a second layer from a surface of the circuit board; and a voltage regulator module comprising at least one discrete inductor coupled to the circuit board, the inductor is positioned over the signal routing lines and configured to generate magnetic field lines that directionally follow the signal routing lines.

11. The computing device of claim 10, in which the at least one inductor further comprises a coiled wire comprising a central axis that is oriented horizontally with the surface of the circuit board.

12. The computing device of claim 11, further comprising a support board coupled to the circuit board for attaching the inductor and positioning the coiled wire in a horizontal configuration.

13. The computing device of claim 12, in which the coiled wire is elongated horizontally along the central axis from the support board.

14. The computing device of claim 10, in which the inductor further comprises:
the coiled wire comprising a first end and a second end; and
a first connection member supporting the first end and a second connection member supporting the second end of the coiled wire, in which the first and second connection members are attached to the surface of the circuit board to position the coiled wire in a horizontal configuration.

15. The computing device of claim 10, in which the at least one inductor further comprises an array of inductors oriented horizontally with the surface of the circuit board.

16. The computing device of claim 15, further comprising a support board coupled to the circuit board for attaching the array of inductors to position their coiled wires in a horizontal configuration.

17. The computing device of claim 16, wherein the array of inductors is a first array of inductors, the circuit board further comprising:
the first array of inductors comprises a first set of elongated coiled wires; and
a second array of inductors oriented horizontally with the surface of the circuit board attached to the support board, the second array of inductors comprises a second set of elongated coiled wires that face in a direction opposite of the first set of elongated coiled wires of the first array of inductors.

18. The computing device of claim 10, wherein the at least one inductor further comprising comprises:
a casing material surrounding the coiled wire; and
a casing support positioned between the casing material and the circuit board.

19. A method comprising:
forming a circuit board comprising a plurality of signal routing lines in a second layer from a surface of the circuit board; and
forming a voltage regulator module comprising at least one discrete inductor coupled to the circuit board and positioned over the signal routing lines, the inductor configured to generate magnetic field lines that directionally follow the signal routing lines.

20. The method of claim 19, further comprising:
attaching a support board to the circuit board, wherein the at least one inductor is coupled to the support board.

* * * * *